(12) United States Patent
Miyashita

(10) Patent No.: US 7,872,544 B2
(45) Date of Patent: Jan. 18, 2011

(54) MODULATION/DEMODULATION APPARATUS AND MODULATION/DEMODULATION METHOD

(75) Inventor: Daisuke Miyashita, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 340 days.

(21) Appl. No.: 12/192,547

(22) Filed: Aug. 15, 2008

(65) Prior Publication Data

US 2009/0051455 A1 Feb. 26, 2009

(30) Foreign Application Priority Data

Aug. 21, 2007 (JP) ............... 2007-214909

(51) Int. Cl.
*H03C 3/02* (2006.01)
*H04L 27/36* (2006.01)
*H04L 27/38* (2006.01)

(52) U.S. Cl. ............ 332/103; 332/105; 329/304; 375/261

(58) Field of Classification Search .......... 332/103, 332/105; 329/304; 375/261
See application file for complete search history.

(56) References Cited

U.S. PATENT DOCUMENTS 5,771,263 A * 6/1998 Kanazawa et al. .......... 375/261
6,560,449 B1 * 5/2003 Liu ............................. 455/302
6,931,343 B2 8/2005 Webster et al.

FOREIGN PATENT DOCUMENTS

JP 2001-7882 1/2001

\* cited by examiner

*Primary Examiner*—Joseph Chang
(74) *Attorney, Agent, or Firm*—Oblon, Spivak, McClelland, Maier & Neustadt, L.L.P.

(57) ABSTRACT

A modulation/demodulation apparatus according to an embodiment of the present invention includes a sine wave generating circuit configured to output two sine waves which are orthogonal to each other and have equal amplitude, an orthogonal modulator connected to the sine wave generating circuit and configured to modulate the sine waves to generate a modulated signal, a detecting section configured to detect amplitude fluctuation in the modulated signal, a multiplying section configured to multiply the modulated signal and the amplitude fluctuation detected by the detecting section together, and an orthogonal demodulator configured to demodulate the modulated signal multiplied with the amplitude fluctuation by the multiplying section to generate a demodulated signal.

20 Claims, 6 Drawing Sheets

MODULATION/DEMODULATION APPARATUS AND MODULATION/DEMODULATION METHOD

CROSS REFERENCE TO RELATED APPLICATIONS

This application is based upon and claims the benefit of priority from the prior Japanese Patent Application No. 2007-214909, filed on Aug. 21, 2007, the entire contents of which are incorporated herein by reference.

BACKGROUND OF THE INVENTION

1. Field of the Invention

The present invention relates to a modulation/demodulation apparatus and a modulation/demodulation method.

2. Background Art

As a type of a signal modulation scheme, an orthogonal modulation scheme is widely known. In the orthogonal modulation scheme, two signals having a phase difference of 90 degrees are collectively transmitted as one combined signal. One signal forming the combined signal is referred to as an I component (in-phase component), and the other signal forming the combined signal is referred to as a Q component (orthogonal component).

In orthogonal modulation processing and orthogonal demodulation processing, uncorrelated errors present in an orthogonal modulation transmitter and an orthogonal demodulation receiver (IQ mismatches) may impose a problem. In the orthogonal modulation transmitter and the orthogonal demodulation receiver, the IQ mismatches have significant influence on apparatus characteristics, such as modulation accuracy of the transmitter and reception sensitivity of the receiver (see JP-A 2001-7882 (KOKAI), for example).

In a modulator-demodulator including an orthogonal modulator and an orthogonal demodulator, in order to correct an IQ mismatch, it is necessary to detect the presence of the IQ mismatch. The IQ mismatch can be detected by modulating, with the orthogonal modulator, two sine waves generated for an IQ mismatch detection which are orthogonal to each other and have equal amplitude, demodulating a modulated signal with the orthogonal demodulator, and analyzing a demodulation result (loop-back test), for example. This makes it possible to detect the IQ mismatch present in the modulator-demodulator. It is possible to correct the IQ mismatch by gradually adjusting a transmission circuit (or a transmission signal) and a reception circuit (or a reception signal) with taking into account a detection result of the IQ mismatch.

However, this method has a drawback in that an IQ mismatch that occurs in the orthogonal modulator and an IQ mismatch that occurs in the orthogonal demodulator cannot be distinguished. There is also a drawback in that, when an IQ mismatch that cancels an IQ mismatch in the orthogonal modulator is present in the orthogonal demodulator, it looks as if no IQ mismatch is present in both the orthogonal modulator and the orthogonal demodulator. Such drawbacks prevent the IQ mismatches from being correctly detected and corrected.

SUMMARY OF THE INVENTION

An aspect of the present invention is, for example, a modulation/demodulation apparatus including a sine wave generating circuit configured to output two sine waves which are orthogonal to each other and have equal amplitude, an orthogonal modulator connected to the sine wave generating circuit and configured to modulate the sine waves to generate a modulated signal, a detecting section configured to detect amplitude fluctuation in the modulated signal, a multiplying section configured to multiply the modulated signal and the amplitude fluctuation detected by the detecting section together, and an orthogonal demodulator configured to demodulate the modulated signal multiplied with the amplitude fluctuation by the multiplying section to generate a demodulated signal.

Another aspect of the present invention is, for example, a modulation/demodulation method including outputting two sine waves which are orthogonal to each other and have equal amplitude, modulating the sine waves to generate a modulated signal, detecting amplitude fluctuation in the modulated signal, multiplying the modulated signal and the amplitude fluctuation detected by the detection together, and demodulating the modulated signal multiplied with the amplitude fluctuation by the multiplication to generate a demodulated signal.

DESCRIPTION OF THE EMBODIMENTS

Embodiments of the present invention will be described below with reference to the accompanying drawings.

First Embodiment

Figure 1:
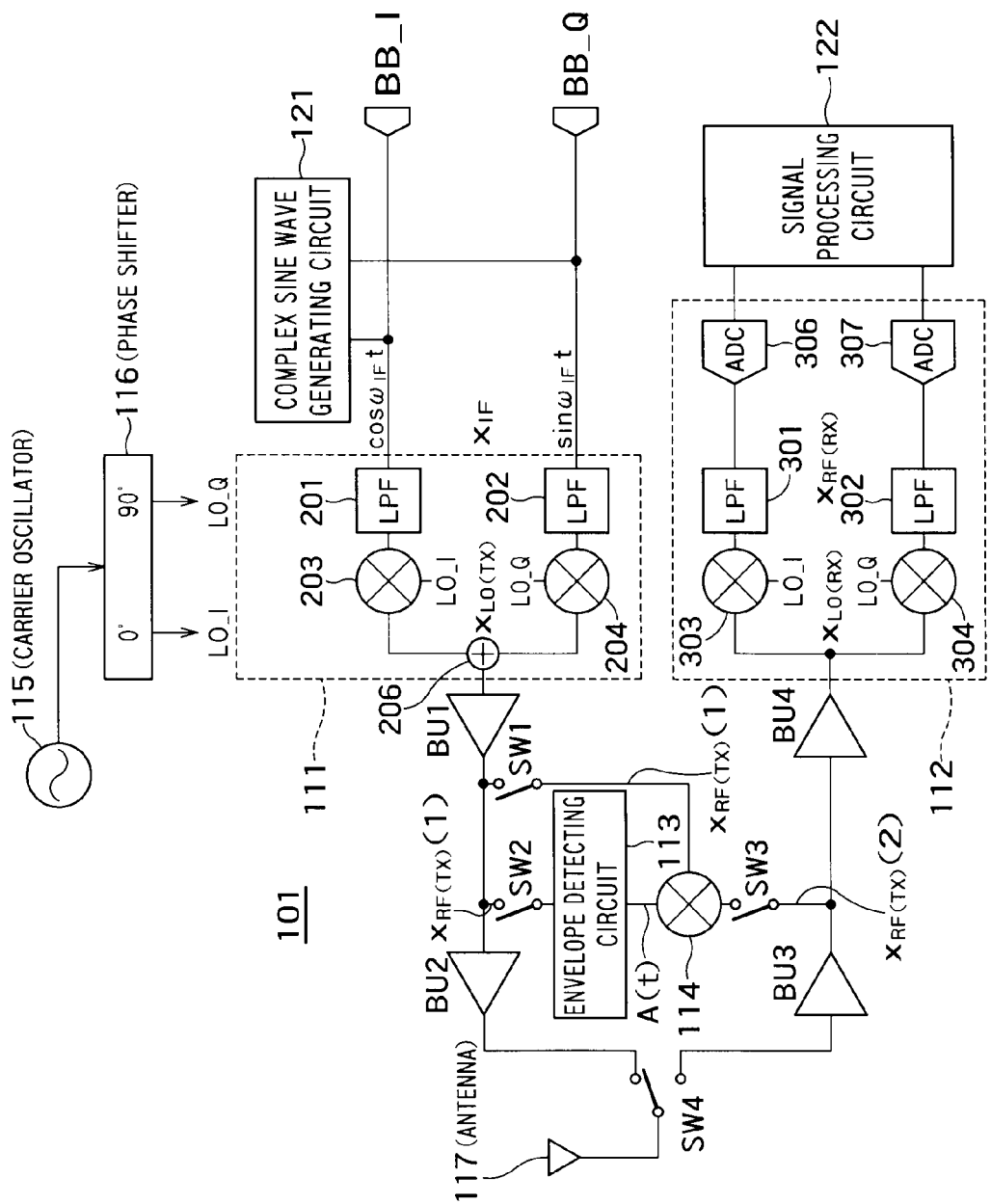
FIG. 1 shows a circuit configuration of a modulator-demodulator according to a first embodiment.

FIG. 1 shows a circuit configuration of a modulator-demodulator 101 according to a first embodiment. The modulator-demodulator 101 shown in FIG. 1 includes an orthogonal modulator 111 which modulates a signal to generate a modulated signal, an orthogonal demodulator 112 which demodulates the modulated signal to generate a demodulated signal, an envelope detecting circuit 113 as an example of a detecting section, a mixer circuit 114 as an example of a multiplying section, a carrier oscillator 115, a phase shifter 116, and an antenna 117. The modulator-demodulator 101 shown in FIG. 1 further includes a complex sine wave generating circuit 121 that generates two sine waves for an IQ mismatch detection, which are orthogonal to each other and have equal amplitude, a signal processing circuit 122 that executes signal processing for the demodulated signal, a first input terminal BB_I, a second input terminal BB_Q, first to fourth buffers BU1 to BU4, and first to fourth switches SW1 to SW4. The modulator-demodulator 101 shown in FIG. 1 is an example of a modulation/demodulation apparatus.

The orthogonal modulator 111 includes a first low-pass filter 201, a second low-pass filter 202, a first multiplier 203, a second multiplier 204, and an adder 206.

The orthogonal demodulator 112 includes a third low-pass filter 301, a fourth low-pass filter 302, a third multiplier 303, a fourth multiplier 304, a first analog-digital converter 306, and a second analog-digital converter 307.

<Components and Connection in the First Embodiment>

An in-phase component (I component) of a baseband signal is inputted from the first input terminal BB_I. An orthogonal component (Q component) of the baseband signal is inputted from the second input terminal BB_Q. The first input terminal BB_I and the second input terminal BB_Q are respectively connected to the first low-pass filter 201 and the second low-pass filter 202 which are described later.

The carrier oscillator 115 outputs a signal of a predetermined frequency as a carrier. The carrier oscillator 115 includes, for example, a crystal oscillator and a PLL (phase locked loop). The carrier oscillator 115 is connected to the phase shifter 116.

The phase shifter 116 is inputted with the carrier outputted from the carrier oscillator 115 and outputs, based on the carrier, a signal phase-shifted by 0 degree (local oscillation signal LO_I) and a signal phase-shifted by 90 degrees (local oscillation signal LO_Q). The phase shifter 116 is connected to the first multiplier 203, the second multiplier 204, the third multiplier 303, and the fourth multiplier 304. The local oscillation signal LO_I is outputted to the first multiplier 203 and the third multiplier 303. The local oscillation signal LO_Q is outputted to the second multiplier 204 and the fourth multiplier 304.

The first low-pass filter 201 and the second low-pass filter 202 are configured to remove harmonic components higher than a predetermined frequency from a signal inputted from the outside and output the signal. In this embodiment, an input of the first low-pass filter 201 is connected to the first input terminal BB_I and an output thereof is connected to the first multiplier 203. In other words, the first low-pass filter 201 is inputted with the I component, removes harmonic components from the I component, and outputs the I component to the first multiplier 203. An input of the second low-pass filter 202 is connected to the second input terminal BB_Q and an output thereof is connected to the second multiplier 204. In other words, the second low-pass filter 202 is inputted with the Q component, removes harmonic components from the Q component, and outputs the Q component to the second multiplier 204.

The first multiplier 203, the second multiplier 204, the third multiplier 303, and the fourth multiplier 304 are configured to multiply two signals inputted from the outside together and output a multiplied signal.

One of two inputs of the first multiplier 203 is connected to an output of the first low-pass filter 201, and the remaining one of the two inputs is connected to an output of the local oscillation signal LO_I of the phase shifter 116. An output of the first multiplier 203 is connected to the adder 206. In other words, the first multiplier 203 multiplies the I component outputted from the first low-pass filter 201 and the local oscillation signal LO_I together to modulate the I component and outputs the I component to the adder 206.

One of two inputs of the second multiplier 204 is connected to an output of the second low-pass filter 202, and the remaining one of the two inputs is connected to an output of the local oscillation signal LO_Q of the phase shifter 116. An output of the second multiplier 204 is connected to the adder 206. In other words, the second multiplier 204 multiplies the Q component outputted from the second low-pass filter 202 and the local oscillation signal LO_Q together to modulate the Q component and outputs the Q component to the adder 206.

The adder 206 is configured to add up two signals inputted from the outside and output an added-up signal. When two current signals are outputted from two multipliers, it is possible to realize addition of the two current signals by feeding the two current signals to a resistor and setting a voltage generated by the resistor as an output. This is represented by a formula Vout=(I1+I2)R.

One of two inputs of the adder 206 is connected to an output of the first multiplier 203, and the remaining one of the two inputs is connected to an output of the second multiplier 204. An output of the adder 206 is connected to the first buffer BU1. In other words, the adder 206 adds up the I component modulated by using the first multiplier 203 and the Q component modulated by using the second multiplier 204 and outputs an added-up component to the first buffer BU1.

As described above, the orthogonal modulator 111 multiplies each of the I component and the Q component inputted from the outside by a carrier to modulate each of them, and adds up the I component and the Q component to output an added-up components.

The first to fourth buffers BU1 to BU4 are driver circuits. An input of the first buffer BU1 is connected to an output of the orthogonal modulator 111 (the output of the adder 206) and an output thereof is connected to an input of the second buffer BU2.

The fourth switch SW4 connects the antenna 117 to one of an output of the second buffer BU2 and an input of the third buffer BU3. In other words, the fourth switch SW4 has three terminals and one of the terminals of the fourth switch SW4 is connected to the antenna 117. Another terminal is connected to the output of the second buffer BU2 and the remaining one terminal is connected to the input of the third buffer BU3. When a signal is transmitted to the outside, the antenna 117 and the output of the second buffer BU2 are connected. When a signal is received from the outside, the antenna 117 and the input of the third buffer BU3 are connected.

An output of the third buffer BU3 is connected to an input of the fourth buffer BU4. An output of the fourth buffer BU4 is connected to the third multiplier 303 and the fourth multiplier 304 in the orthogonal demodulator 112.

One of two inputs of the third multiplier 303 is connected to the output of the fourth buffer BU4, and the remaining one of the two inputs is connected to the output of the local oscillation signal LO_I of the phase shifter 116. An output of the third multiplier 303 is connected to the third low-pass filter 301. In other words, the third multiplier 303 multiplies a signal outputted from the fourth buffer BU4 and the local oscillation signal LO_I together to extract an I component from the signal outputted from the fourth buffer BU4.

The third low-pass filter 301 is configured to remove harmonic components higher than a predetermined frequency from a signal inputted thereto and output the signal. In this embodiment, an input of the third low-pass filter 301 is connected to an output of the third multiplier 303 and an output of thereof is connected to the first analog-digital converter 306. In other words, the third low-pass filter 301 is inputted with the I component extracted by the third multiplier 303, removes harmonic components from the extracted I components, and outputs the I component to the first analog-digital converter 306.

The first analog-digital converter 306 is configured to convert an inputted analog signal into a digital value of a predetermined number of bits. In this embodiment, an input of the first analog-digital converter 306 is connected to an output of the third low-pass filter 301. An output of the first analog-digital converter 306 is connected to the signal processing circuit 122.

One of two inputs of the fourth multiplier 304 is connected to the output of the fourth buffer BU4, and the remaining one of the two inputs is connected to the output of the local oscillation signal LO_Q of the phase shifter 116. An output of the fourth multiplier 304 is connected to the fourth low-pass filter 302. In other words, the fourth multiplier 304 multiplies a signal outputted from the fourth buffer BU4 and the local oscillation signal LO_Q together to extract a Q component from the signal outputted from the fourth buffer BU4.

The fourth low-pass filter 302 is configured to remove harmonic components higher than a predetermined frequency from an inputted signal and output the signal. In this embodiment, an input of the fourth low-pass filter 302 is connected to the output of the fourth multiplier 304 and an output thereof is connected to the second analog-digital converter 307. In other words, the forth low-pass filter 302 is inputted with the Q component extracted by the fourth multiplier 304, removes harmonic components from the extracted Q component, and outputs the Q component to the second analog-digital converter 307.

The second analog-digital converter 307 is configured to convert an inputted analog signal into a digital value of a predetermined number of bits. In this embodiment, an input of the second analog-digital converter 307 is connected to an output of the fourth low-pass filter 302. An output of the second analog-digital converter 307 is connected to the signal processing circuit 122.

The signal processing circuit 122 is configured to perform digital signal processing. The signal processing circuit 122 demodulates a received signal, based on signals from the first analog-digital converter 306 and the second analog-digital converter 307. The digital signal processing includes executing predetermined filter processing or the like on an inputted signal represented on a time axis, and finally converting the signal into a signal represented on a frequency axis using Fourier transform to demodulate the signal.

As described above, in this embodiment, when a signal is transmitted to the outside, a path of the orthogonal modulator 111, the first buffer BU1, the second buffer BU2, and the antenna 117 is connected. When a signal is received, a path of the antenna 117, the third buffer BU3, the fourth buffer BU4, the orthogonal demodulator 112, and the signal processing circuit 122 is connected.

In this embodiment, as described above, the modulator-demodulator 101 further includes, in addition to the circuits and the paths for normally transmitting and receiving signals, the complex sine wave generating circuit 121, the first switch SW1 to the third switch SW3, the envelope detecting circuit 113, and the mixer circuit 114.

The complex sine wave generating circuit 121 outputs two sine waves indicated by $\cos \omega_{IF} t$ and $\sin \omega_{IF} t$, where $\omega_{IF}$ denotes the frequency of a sine wave. The complex sine wave generating circuit 121 has two output signal lines and outputs separate sine waves through the output signal lines, respectively. One output signal line of the complex sine wave generating circuit 121 is connected to between the first input terminal BB_I and the first low-pass filter 201. The sine wave indicated by $\cos \omega_{IF} t$ is outputted through the output signal line. The remaining one output signal line of the complex sine wave generating circuit 121 is connected to between the second input terminal BB_Q and the second low-pass filter 202. The sine wave indicated by $\sin \omega_{IF} t$ is outputted through the output signal line.

The envelope detecting circuit 113 is configured to extract an envelope component (amplitude change component) from an inputted signal. The mixer circuit 114 is configured to multiply two signals inputted from the outside together and output a multiplied signal, like the first multiplier 203 for example. Each of the first to third switches SW1 to SW3 has two terminals. In this embodiment, the envelope detecting circuit 113 and the mixer circuit 114 are connected between the first buffer BU1 and the second buffers BU2, and between the third buffer BU3 and the fourth buffer BU4, via the first to third switches SW1 to SW3.

Specifically, the envelope detecting circuit 113 and the mixer circuit 114 are connected as described below. One end of the first switch SW1 is connected between the first buffer BU1 and the second buffer BU2. The remaining one end of the first switch SW1 is connected to one of the inputs of the mixer circuit 114. One end of the second switch SW2 is connected to between the first buffer BU1 and the second buffer BU2. The remaining one end of the second switch SW2 is connected to an input of the envelope detecting circuit 113. An output of the envelope detecting circuit 113 is connected to the remaining one of the inputs of the mixer circuit 114. An output of the mixer circuit 114 is connected to one end of the third switch SW3. The remaining one end of the third switch SW3 is connected to between the third buffer BU3 and the fourth buffer BU4.

<Mechanism of IQ Mismatch Detection in this Embodiment>

Figure 3:
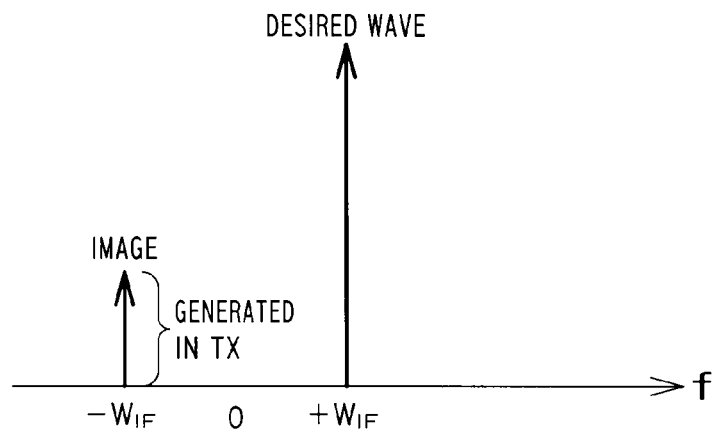
FIG. 3 illustrates a frequency distribution of a demodulated signal when an IQ mismatch is present in an orthogonal modulator.

First, when an IQ mismatch is present on a transmission side Tx, as shown in FIG. 3, an image is generated besides a desired wave. A frequency axis is shown in FIG. 3. However, when represented on a time axis, if there is only the desired wave, the desired wave is a sine wave of a fixed frequency (amplitude is fixed and a phase is proportional to time). This is represented by a formula $A \cos(\omega t + \theta)$ (amplitude A and a phase θ are constants). On the other hand, when there is the image, both amplitude and a phase fluctuate in a wave. This is represented by a formula $A(t)\cos(\omega t + \theta(t))$. In other words, when the waves with the IQ mismatch and the waves without the IQ mismatch are compared, the amplitude A is replaced with $A(t)$, the phase θ is replaced with $\theta(t)$, and the amplitude and the phase change with time.

Therefore, if signal amplitude fluctuation (envelope ($A(t)$)) is extracted, it is possible to detect presence of the IQ mismatch in the Tx signal.

Figure 6:
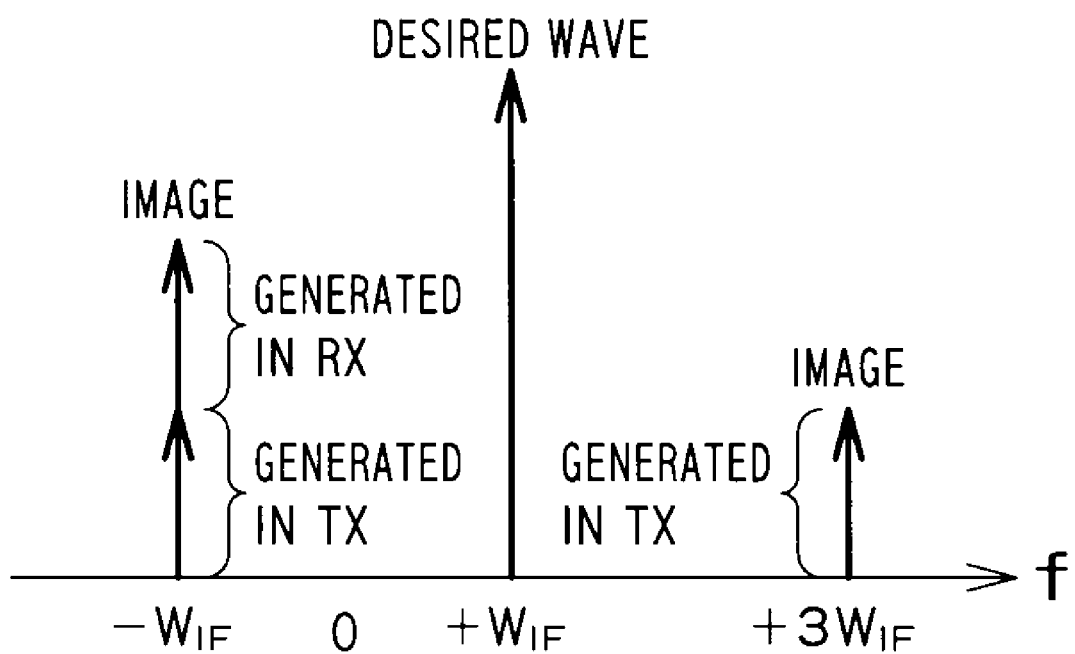
FIG. 6 illustrates a frequency distribution of a demodulated signal when IQ mismatches are present in an orthogonal modulator and an orthogonal demodulator (first embodiment)

In this embodiment, a signal and an envelope signal of this signal is multiplied together. This is equivalent to re-placing information concerning the IQ mismatch on the Tx signal (applying AM modulation to the Tx signal). When represented on the frequency axis, an AM modulation signal is a frequency spectrum symmetrical to both sides of a carrier frequency. Therefore, a spectrum shown in FIG. 6 is obtained.

Consequently, an image generated on the transmission side Tx and an image generated on a reception side Rx can be separated on the frequency axis.

Figure 5:
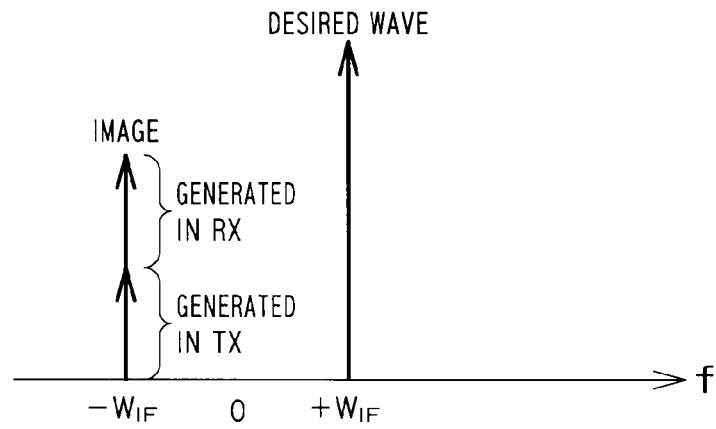
FIG. 5 illustrates a frequency distribution of a demodulated signal when IQ mismatches are present in an orthogonal modulator and an orthogonal demodulator.

On the other hand, when a comparative example is used, as shown in FIG. 5, an image generated on the transmission side Tx and an image generated on the reception side Rx cannot be separated on the frequency axis.

<Detection Path for an IQ Mismatch>

When an IQ mismatch is detected, all of the first to third switches SW1 to SW3 are in a connected state. In this case, a signal outputted from the first buffer BU1 is inputted to the mixer circuit 114 via the first switch SW1, and inputted to the mixer circuit 114 via the second switch SW2 and through the envelope detecting circuit 113. An output of the mixer circuit 114 is inputted to the fourth buffer BU4 via the third switch SW3.

A complex sine wave $x_{IF}$ generated by the complex sine wave generating circuit 121 is inputted to the orthogonal modulator 111 and modulated into a modulated signal $x_{RF(TX)}$ (1). The modulated signal $x_{RF(TX)}$ (1) is outputted from the orthogonal modulator 111.

The modulated signal $x_{RF(TX)}$ (1) is inputted to the envelope detecting circuit 113. An envelope A(t) of the modulated signal $x_{RF(TX)}$ (1) is detected by the envelope detecting circuit 113. An envelope signal A(t) is outputted from the envelope detecting circuit 113.

Each of the modulated signal $x_{RF(TX)}$ (1) and the envelope signal A(t) is inputted to the mixer circuit 114. The modulated signal $x_{RF(TX)}$(1) and the envelope signal A(t) are multiplied together by the mixer circuit 114. A modulated signal $x_{RF(TX)}$ (2) obtained by multiplying the modulated signal $x_{RF(TX)}$ (1) and the envelope signal A(t) is outputted from the mixer circuit 114.

The modulated signal $x_{RF(TX)}$ (2) is inputted to the orthogonal demodulator 112 and demodulated into a demodulated signal $x_{RF(RX)}$. Then, for the demodulated signal $x_{RF(RX)}$ converted from an analog signal into a digital signal by the orthogonal demodulator 112, digital signal processing is executed by the signal processing circuit 122. An IQ mismatch present in the modulator-demodulator 101 is detected by the signal processing.

In the first embodiment, the plural buffers BU are arranged between the orthogonal modulator 111 and the orthogonal demodulator 112. These buffers BU may be replaced with inverters or lines. Further, in the first embodiment, the plural switches SW are arranged between the orthogonal modulator 111 and the orthogonal demodulator 112. These switches SW may be replaced with couplers, distributors, or lines.

Figure 2:
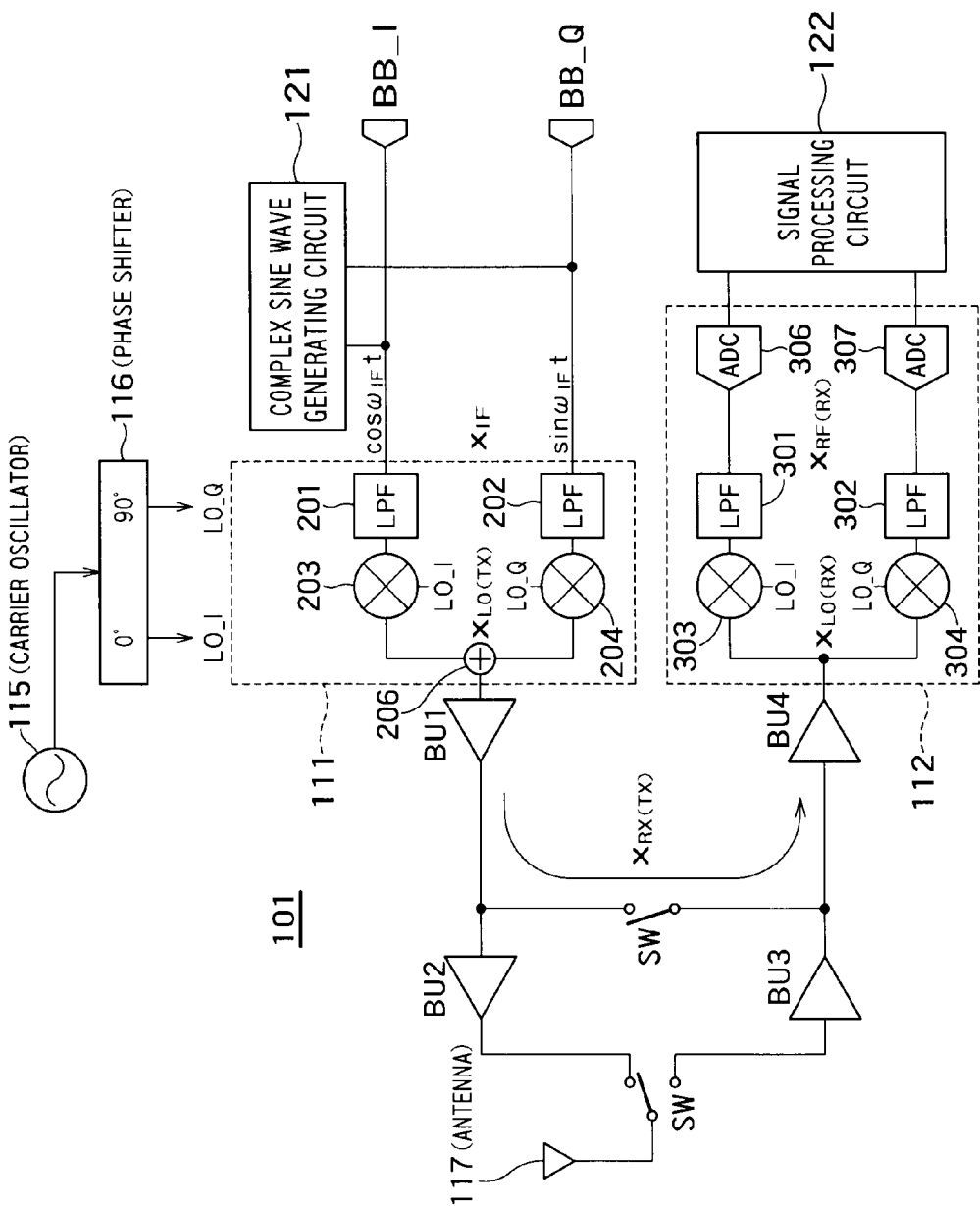
FIG. 2 shows a circuit configuration of a modulator-demodulator according to a comparative example.

FIG. 2 shows a circuit configuration of a modulator-demodulator 101 according to a comparative example. The modulator-demodulator 101 shown in FIG. 2 includes an orthogonal modulator 111 which modulates a signal to generate a modulated signal, and an orthogonal demodulator 112 which demodulates the modulated signal to generate a demodulated signal. The modulator-demodulator 101 shown in FIG. 2 further includes a complex sine wave generating circuit 121 that generates a highly accurate complex sine wave for an IQ mismatch detection, a signal processing circuit 122 that executes signal processing for the demodulated signal, and circuit elements such as buffers and switches.

<Definition of an IQ Mismatch>

Both the modulator-demodulators 101 according to the first embodiment and the comparative example are modulator-demodulators of an orthogonal modulation/demodulation scheme. In the orthogonal modulation/demodulation scheme, two signals having a phase difference of 90 degrees are collectively transmitted as one combined signal. One signal forming the combined signal is referred to as an I component (in-phase component), and the other signal forming the combined signal is referred to as a Q component (orthogonal component).

In orthogonal modulation/demodulation processing, characteristics of signal processing in the orthogonal modulator 111 and the orthogonal demodulator 112 are represented as linear distortion. For example, the phase difference between the I component and the Q component may shift from 90 degrees, or a difference may occur in the amplitudes of the I component and the Q component. Such linear distortion is referred to as IQ mismatch. IQ mismatches present in the orthogonal modulator 111 and the orthogonal demodulator 112 have significant influence on modulation accuracy of the orthogonal modulator 111 and reception sensitivity of orthogonal demodulator 112. In order to correct the IQ mismatches, it is necessary to detect the presence of the IQ mismatches. However, the detection of the IQ mismatches has problems explained below in the comparative example.

<Operation Example of the Modulator-Demodulator According to the Comparative Example (FIG. 2)>

Figure 4:
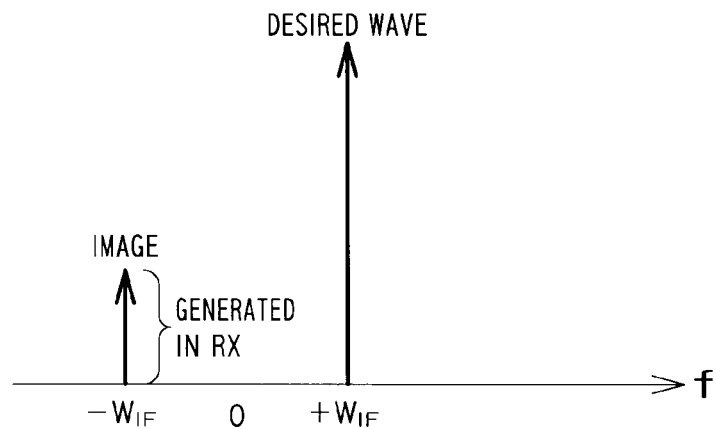
FIG. 4 illustrates a frequency distribution of a demodulated signal when an IQ mismatch is present in an orthogonal demodulator.

In the beginning, an operation example of the modulator-demodulator 101 according to the comparative example is explained. First, an operation performed when an IQ mismatch is present in the orthogonal modulator 111 is explained with reference to formulas (1 to 5) and FIG. 3. Next, an operation performed when an IQ mismatch is present in the orthogonal demodulator 112 is explained with reference to formulas (6 to 10) and FIG. 4. Lastly, an operation performed when IQ mismatches are present in the orthogonal modulator 111 and the orthogonal demodulator 112 is explained with reference to formulas (11 to 14) and FIG. 5. FIGS. 3 to 5 illustrate frequency distributions of demodulated signals in the respective cases. The frequency distribution shown in FIG. 3 and the frequency distribution shown in FIG. 4 are reflected on the frequency distribution shown in FIG. 5.

An orthogonal modulation executed by the orthogonal modulator 111 and an orthogonal demodulation executed by the orthogonal demodulator 112 will be explained by showing an example of an orthogonal modulation/demodulation in which the orthogonal modulator 111 modulates a complex sine wave $x_{IF}$ into a modulated signal $x_{RF(TX)}$ and the orthogonal demodulator 112 demodulates the modulated signal $x_{RF(TX)}$ into a demodulated signal $x_{RF(RX)}$. An LO signal described later means a local oscillation signal.

First, an operation performed when an IQ mismatch is present in the orthogonal modulator 111 is explained. Signal waveforms of the complex sine wave $x_{IF}$, an LO signal $x_{LO(TX)}$ for orthogonal modulation, and an LO signal $x_{LO(RX)}$ for orthogonal demodulation are defined as indicated by formulas (1), (2), and (3). $\omega_{IF}$ and $\omega_{LO}$ represent the frequency of the complex sine wave $x_{IF}$ and the frequency of the LO signal $x_{LO(TX)}$ and the LO signal $x_{LO(RX)}$, respectively. $\epsilon$ and $\phi$ represent an amplitude difference and a phase error between an I component and a Q component of the LO signal $x_{LO(TX)}$, respectively, where $\epsilon\phi\ll 1$. In this way, it is assumed that the IQ mismatch is present in the LO signal $x_{LO(TX)}$.

$$x_{IF} = \cos(\omega_{IF}t) + j\sin(\omega_{IF}t) = \exp(j\omega_{IF}t) \qquad (1)$$

-continued $$x_{LO(TX)} = \left(1 + \frac{\varepsilon}{2}\right)\cos\left(\omega_{LO}t + \frac{\varphi}{2}\right) + j\left(1 - \frac{\varepsilon}{2}\right)\sin\left(\omega_{LO}t - \frac{\varphi}{2}\right) \quad (2)$$

$$= \left(1 + \frac{\varepsilon}{2}\right)\left\{\cos(\omega_{LO}t)\cos\left(\frac{\varphi}{2}\right) - \sin(\omega_{LO}t)\sin\left(\frac{\varphi}{2}\right)\right\} +$$

$$j\left(1 + \frac{\varepsilon}{2}\right)\left\{\sin(\omega_{LO}t)\cos\left(\frac{\varphi}{2}\right) - \cos(\omega_{LO}t)\sin\left(\frac{\varphi}{2}\right)\right\}$$

$$\approx [\cos(\omega_{LO}t) + j\sin(\omega_{LO}t)] + \frac{\varepsilon}{2}[\cos(\omega_{LO}t) -$$

$$j\sin(\omega_{LO}t)] - \frac{\varphi}{2}[\sin(\omega_{LO}t) + j\cos(\omega_{LO}t)]$$

$$= [\cos(\omega_{LO}t) + j\sin(\omega_{LO}t)] + \frac{\varepsilon}{2}[\cos(\omega_{LO}t) -$$

$$j\sin(\omega_{LO}t)] - j\frac{\varphi}{2}[\cos(\omega_{LO}t) + j\sin(\omega_{LO}t)]$$

$$= \exp\{j(+\omega_{LO})t\} + \frac{\varepsilon}{2}\exp\{j(-\omega_{LO})t\} -$$

$$j\frac{\varphi}{2}\exp\{j(-\omega_{LO})t\}$$

$$x_{LO(RX)} = \cos(\omega_{LO}t) - j\sin(\omega_{LO}t) = \exp(-j\omega_{LO}t) \quad (3)$$

In this case, the signal waveform of the modulated signal $x_{RF(TX)}$ is represented by formula (4). The signal waveform of the demodulated signal $x_{RF(RX)}$ is represented by formula (5). The frequency distribution of the demodulated signal $x_{RF(RX)}$ is shown in FIG. 3. As shown in FIG. 3, in the demodulated signal $x_{RF(RX)}$, a desired wave component at a frequency $+\omega_{IF}$ and an image component at a frequency $-\omega_{IF}$ are generated.

$$x_{RF(TX)} = \text{Re}(x_{IF} \times x_{LO(TX)}) \quad (4)$$

$$= \cos\{(\omega_{LO} + \omega_{IF})t\} + \frac{\varepsilon}{2}\cos\{(\omega_{LO} - \omega_{IF})t\} -$$

$$\frac{\varphi}{2}\sin\{(\omega_{LO} - \omega_{IF})t\}$$

$$x_{RF(RX)} = x_{RF(TX)} \times x_{LO(RX)} \quad (5)$$

$$\cong [\cos(\omega_{IF}t) + j\sin(\omega_{IF}t)] + \frac{\varepsilon}{2}[\cos(\omega_{IF}t) -$$

$$j\sin(\omega_{IF}t)] + \frac{\varphi}{2}[\sin(\omega_{IF}t) + j\cos(\omega_{IF}t)]$$

$$= [\cos(\omega_{IF}t) + j\sin(\omega_{IF}t)] + \frac{\varepsilon}{2}[\cos(\omega_{IF}t) -$$

$$j\sin(\omega_{IF}t)] + j\frac{\varphi}{2}[\cos(\omega_{IF}t) - j\sin(\omega_{IF}t)]$$

$$= \exp\{j(+\omega_{IF})t\} + \frac{\varepsilon}{2}\exp\{j(-\omega_{IF})t\} +$$

$$j\frac{\varphi}{2}\exp\{j(-\omega_{IF})t\}$$

Next, an operation performed when an IQ mismatch is present in the orthogonal demodulator 112 is explained. Signal waveforms of the complex sine wave $x_{IF}$, the LO signal $x_{LO(TX)}$ for orthogonal modulation, and the LO signal $x_{LO(RX)}$ for orthogonal demodulation are defined as indicated by formulas (6), (7), and (8). $\omega_{IF}$ and $\omega_{LO}$ represent the frequency of the complex sine wave $x_{IF}$ and the frequency of the LO signal $x_{LO(TX)}$ and the LO signal $x_{LO(RX)}$, respectively. $\varepsilon'$ and $\varphi'$ represent an amplitude difference and a phase error between the I component and the Q component of the LO signal $x_{LO(RX)}$, respectively, where $\varepsilon'\varphi' \ll 1$. In this way, it is assumed that the IQ mismatch is present in the LO signal $x_{LO(RX)}$.

$$x_{IF} = \cos(\omega_{IF}t) + j\sin(\omega_{IF}t) = \exp(j\omega_{IF}t) \quad (6)$$

$$x_{LO(TX)} = \cos(\omega_{LO}t) + j\sin(\omega_{LO}t)\exp(j\omega_{LO}t) \quad (7)$$

$$x_{LO(RX)} = \left(1 + \frac{\varepsilon'}{2}\right)\cos\left(\omega_{LO}t + \frac{\varphi'}{2}\right) + j\left(1 - \frac{\varepsilon'}{2}\right)\sin\left(\omega_{LO}t - \frac{\varphi'}{2}\right) \quad (8)$$

$$= \left(1 + \frac{\varepsilon'}{2}\right)\left\{\cos(\omega_{LO}t)\cos\left(\frac{\varphi'}{2}\right) - \sin(\omega_{LO}t)\sin\left(\frac{\varphi'}{2}\right)\right\} -$$

$$j\left(1 - \frac{\varepsilon'}{2}\right)\left\{\sin(\omega_{LO}t)\cos\left(\frac{\varphi'}{2}\right) - \cos(\omega_{LO}t)\sin\left(\frac{\varphi'}{2}\right)\right\}$$

$$\approx [\cos(\omega_{LO}t) - j\sin(\omega_{LO}t)] + \frac{\varepsilon'}{2}[\cos(\omega_{LO}t) +$$

$$j\sin(\omega_{LO}t)] - \frac{\varphi'}{2}[\sin(\omega_{LO}t) - j\cos(\omega_{LO}t)]$$

$$= [\cos(\omega_{LO}t) - j\sin(\omega_{LO}t)] + \frac{\varepsilon'}{2}[\cos(\omega_{LO}t) +$$

$$j\sin(\omega_{LO}t)] + j\frac{\varphi'}{2}[\cos(\omega_{LO}t) + j\sin(\omega_{LO}t)]$$

$$= \exp\{j(-\omega_{LO})t\} + \frac{\varepsilon'}{2}\exp\{j(+\omega_{LO})t\} + j\frac{\varphi'}{2}\exp(+\omega_{LO})t\}$$

In this case, the signal waveform of the modulated signal $x_{RF(TX)}$ is represented by formula (9). The signal waveform of the demodulated signal $x_{RF(RX)}$ is represented by formula (10). The frequency distribution of the demodulated signal $x_{RF(RX)}$ is shown in FIG. 4. As shown in FIG. 4, in the demodulated signal $x_{RF(RX)}$, a desired wave component at a frequency $+\omega_{IF}$ and an image component at a frequency $-\omega_{IF}$ are generated.

$$x_{RF(TX)} = \text{Re}(x_{IF} \times x_{LO(TX)}) \quad (9)$$

$$= \cos\{(\omega_{LO} + \omega_{IF})t\}$$

$$x_{RF(RX)} = x_{RF(TX)} \times x_{LO(RX)} \quad (10)$$

$$\cong [\cos(\omega_{IF}t) + j\sin(\omega_{IF}t)] + \frac{\varepsilon'}{2}[\cos(\omega_{IF}t) -$$

$$j\sin(\omega_{IF}t)] + j\frac{\varphi'}{2}[\cos(\omega_{IF}t) - j\sin(\omega_{IF}t)]$$

$$= \exp\{j(+\omega_{IF})t\} + \frac{\varepsilon'}{2}\exp\{j(-\omega_{IF})t\} +$$

$$j\frac{\varphi'}{2}\exp\{j(-\omega_{IF})t\}$$

Therefore, when the IQ mismatches are present in the orthogonal modulator 111 and the orthogonal demodulator 112, signal waveforms of the modulated signal $x_{RF(TX)}$ and the demodulated signal $x_{RF(RX)}$ are represented by formula (11) and formula (12), respectively. The frequency distribution of the demodulated signal $x_{RF(RX)}$ is shown in FIG. 5. As shown in FIG. 5, in the demodulated signal $x_{RF(RX)}$, both of an image component due to the IQ mismatch in the orthogonal modulator 111 and an image component due to the IQ mismatch in the orthogonal demodulator 112 are generated at a frequency $\omega_{IF}$. Therefore, in this case, the IQ mismatch that occurs in the orthogonal modulator 111 and the IQ mismatch that occurs in the orthogonal demodulator 112 cannot be distinguished.

$$x_{RF(TX)} = \text{Re}(x_{IF} \times x_{LO(TX)}) \quad (11)$$

$$= \cos\{(\omega_{LO} + \omega_{IF})t\} + \frac{\varepsilon}{2}\cos\{(\omega_{LO} - \omega_{IF})t\} -$$

$$\frac{\varphi}{2}\sin\{(\omega_{LO} - \omega_{IF})t\}$$

-continued $$x_{RF(RX)} = x_{RF(TX)} \times x_{LO(RX)} \quad (12)$$
$$= \exp\{j(+\omega_{IF})t\} + \left(\frac{\varepsilon}{2} + \frac{\varepsilon'}{2}\right)\exp\{j(-\omega_{IF})t\} +$$
$$j\left(\frac{\varphi}{2} + \frac{\varphi'}{2}\right)\exp\{j(-\omega_{IF})t\}$$

Moreover, when the IQ mismatches are present in the orthogonal modulator 111 and the orthogonal demodulator 112, if $\varepsilon$ and $\phi$ of the LO signal $x_{LO(TX)}$ and $\varepsilon'$ and $\phi'$ of the LO signal $x_{LO(RX)}$ have opposite signs ($\varepsilon'=-\varepsilon$ and $\phi'=-\phi$), signal waveforms of the modulated signal $x_{RF(TX)}$ and the demodulated signal $x_{RF(RX)}$ are represented by formula (13) and formula (14), respectively. In this way, in the demodulated signal $x_{RF(RX)}$, the image component due to the IQ mismatch in the orthogonal modulator 111 and the image component due to the IQ mismatch in the orthogonal demodulator 112 cancel each other. Therefore, in this case, it looks as if no IQ mismatch is present both in the orthogonal modulator 111 and the orthogonal demodulator 112.

$$x_{RF(TX)} = \text{Re}(x_{IF} \times x_{LO(TX)}) \quad (13)$$
$$= \cos\{(\omega_{LO} + \omega_{IF})t\} + \frac{\varepsilon}{2}\cos\{(\omega_{LO} - \omega_{IF})t\} -$$
$$\frac{\varphi}{2}\sin\{(\omega_{LO} - \omega_{IF})t\}$$

$$x_{RF(RX)} = x_{RF(TX)} \times x_{LO(RX)} \quad (14)$$
$$= \exp\{j(+\omega_{IF})t\} + \left(\frac{\varepsilon}{2} - \frac{\varepsilon}{2}\right)\exp\{j(-\omega_{IF})t\} +$$
$$j\left(\frac{\varphi}{2} - \frac{\varphi}{2}\right)\exp\{j(-\omega_{IF})t\}$$
$$= \exp(j\omega_{IF}t)$$

<Details of a Detection Mechanism for an IQ Mismatch Employing an Envelope Detecting Circuit>

As described above, in the comparative example, when the IQ mismatch is present in the orthogonal modulator 111, the desired wave component at the frequency $+\omega_{IF}$ and the image component at the frequency $-\omega_{IF}$ are generated in the demodulated signal $x_{RF(RX)}$ (FIG. 3). Similarly, when the IQ mismatch is present in the orthogonal demodulator 112, the desired wave component at the frequency $+\omega_{IF}$ and the image component at the frequency $-\omega_{IF}$ are generated in the demodulated signal $x_{RF(RX)}$ (FIG. 4). Therefore, when the IQ mismatches are present in the orthogonal modulator 111 and the orthogonal demodulator 112, the image component due to the IQ mismatch in the orthogonal modulator 111 and the image component due to the IQ mismatch in the orthogonal demodulator 112 overlap and cannot be distinguished (FIG. 5). Therefore, in order to detect the IQ mismatch in the orthogonal modulator 111 and the IQ mismatch in the orthogonal demodulator 112 independently from each other, it is necessary to separate these image components on a frequency axis.

Now, the modulated signal $x_{RF(TX)}$ in the comparative example is examined. As described later, $x_{RF(TX)}$ has a waveform whose amplitude and phase fluctuate according to time. This can be represented as, for example, $A(t)\cos(\omega_{RF}t+P(t))$ where $\omega_{RF}=\omega_{LO}+\omega_{IF}$. If an IQ mismatch is not present in the orthogonal modulator 111, as it is seen by substituting $\varepsilon=0$ and $\phi=0$ in formula (4), $A(t)=1$ and $P(t)=0$, i.e., a sine wave with fixed amplitude and a fixed frequency is obtained. Conversely, when an IQ mismatch is present in the orthogonal modulator 111, $A(t)$ and $P(t)$ fluctuate according to time. In other words, information concerning whether an IQ mismatch is present is included in $A(t)$. Therefore, in the first embodiment, $A(t)$ is used for detecting the IQ mismatch present in the orthogonal modulator 111. $A(t)$ is referred to an envelope of a modulated signal.

In the first embodiment, an envelope of a modulated signal is detected by the envelope detecting circuit 113, and the modulated signal and the envelope thereof are multiplied together by the mixer circuit 114. This is equivalent to applying AM modulation to the modulated signal and re-placing "information" concerning the envelope on the modulated signal. When represented on the frequency axis, an AM modulation signal provides a frequency spectrum which is symmetrical to both sides of a carrier frequency. Therefore, in the first embodiment, when IQ mismatches are present in the orthogonal modulator 111 and the orthogonal demodulator 112, the frequency distribution of the demodulated signal $x_{RF(RX)}$ becomes as shown in FIG. 6. In the first embodiment, as shown in FIG. 6, whereas the image component due to the IQ mismatch in the orthogonal demodulator 112 is generated at only $-\omega_{IF}$, the image component due to the IQ mismatch in the orthogonal modulator 111 is generated at $-\omega_{IF}$ and $+\omega_{IF}$. Therefore, in the first embodiment, the IQ mismatch in the orthogonal modulator 111 and the IQ mismatch in the orthogonal demodulator 112 can be detected independently from each other. Details of the first embodiment are described later.

<An Operation Example of the Modulator-demodulator According to the First Embodiment (FIG. 1)>

An operation example of the modulator-demodulator 101 according to the first embodiment is explained below. Specifically, an operation performed when IQ mismatches are present in the orthogonal modulator 111 and the orthogonal demodulator 112 is explained with reference to formulas (15 to 24) and FIG. 6. FIG. 6 illustrates a frequency distribution of a demodulated signal in this case. In the frequency distribution shown in FIG. 6, there is a frequency component which is not present in the frequency distribution in FIG. 5.

The operation performed when the IQ mismatches are present in the orthogonal modulator 111 and the orthogonal demodulator 112 is explained. Waveforms of the complex sine wave $x_{IF}$, the LO signal $x_{LO(TX)}$ for orthogonal modulation, and the LO signal $x_{LO(RX)}$ for orthogonal demodulation are defined as indicated by formula (1 or 6), formula (2), and formula (7), respectively. Therefore, the waveform of the modulated signal $x_{RF(TX)}$ (1) is represented by formula (4). Here, this formula is rewritten as formula (15), where $\omega_{RF}=\omega_{LO}+\omega_{IF}$. On the other hand, when the modulated signal $x_{RF(TX)}$ (1) is regarded as a modulated wave obtained by modulating a carrier at a frequency $\omega_{RF}$ with the amplitude $A(t)$ and the phase $P(t)$, the modulated signal $x_{RF(TX)}$(1) can also be represented by formula (16), where $\alpha \ll 1$.

$$x_{RF(TX)}(1) = \cos(\omega_{RF}t) + \alpha\cos\{(\omega_{RF} - 2\omega_{IF})t\} \quad (15)$$
$$= \cos(\omega_{RF}t) + \alpha\cos(\omega_{RF}t)\cos(2\omega_{IF}t) +$$
$$\alpha\sin(\omega_{RF}t)\sin(2\omega_{IF}t)$$

$$x_{RF(TX)}(1) = A(t)\cos(\omega_{RF}t + P(t)) \quad (16)$$
$$= A(t)\cos(\omega_{RF}t)\cos\{P(t)\} - A(t)\sin(\omega_{RF}t)\sin\{P(t)\}$$

From an equation with formula (15) and formula (16) set on a left side and a right side thereof, respectively, formula (17) and formula (18) are derived.

$$\cos(\omega_{RF}t)+\alpha(\omega_{RF}t)\cos(2\omega_{IF}t)=A(t)\cos(\omega_{RF}t)\cos\{P(t)\} \quad (17)$$

$$\alpha\sin(\omega_{RF}t)\sin(2\omega_{IF}t)=-A(t)\sin(\omega_{RF}t)\sin\{P(t)\} \quad (18)$$

Formula (19) and formula (20) below are derived from formula (17) and formula (18).

$$1+\alpha \cos(2\omega_{IF}t) = A(t)\cos\{P(t)\} \quad (19)$$

$$\alpha \sin(2\omega_{IF}t) = -A(t)\sin\{P(t)\} \quad (20)$$

When both sides of a formula obtained by squaring both sides of formula (19) and both sides of a formula obtained by squaring the both sides of formula (20) are added up, formula (21) below is derived.

$$\{1+\alpha \cos(2\omega_{IF}t)\}^2 + \{\alpha \sin(2\omega_{IF}t)\}^2 = \{A(t)\}^2 \quad (21)$$

When formula (21) is solved with respect to A(t), formula (22) below is derived.

$$A(t) = \sqrt{1+2\alpha\cos(2\omega_{IF}t)} \approx 1\alpha \cos(2\omega_{IF}t) \quad (22)$$

This A(t) is the envelope (amplitude fluctuation) of the modulated signal $x_{RF(TX)}$ (1). A(t) is detected by the envelope detecting circuit 113. A(t) and the modulated signal $x_{RF(TX)}$ (1) are multiplied together by the mixer circuit 114. Therefore, the signal waveform of the modulated signal $x_{RF(TX)}$ (2) is represented by formula (23).

$$\begin{aligned}x_{RF(TX)}(2) &= [\cos(\omega_{RF}t) + \alpha\cos\{(\omega_{RF}-2\omega_{IF})t\}] \times \\ &\quad [1+\alpha\cos(2\omega_{IF}t)] \\ &\approx \{1+\alpha\cos(2\omega_{IF}t)\}\cos(\omega_{RF}t) + \\ &\quad \alpha\cos\{(\omega_{RF}-2\omega_{IF})t\} \\ &= \cos(\omega_{RF}t) + \frac{1}{2}\alpha[\cos\{(\omega_{RF}+2\omega_{IF})t\} + \\ &\quad 3\cos\{(\omega_{RF}-2\omega_{IF})t\}]\end{aligned} \quad (23)$$

Therefore, the signal waveform of the demodulated signal $x_{RF(RX)}$ is represented by formula (24). The frequency distribution of the demodulated signal $x_{RF(RX)}$ is shown in FIG. 6. As shown in FIG. 6, a desired wave component at a frequency $+\omega_{IF}$ and image components at a frequency $-\omega_{IF}$ and a frequency $+3\omega_{IF}$ are generated in the demodulated signal $x_{RF(RX)}$. The image component at the frequency $-\omega_{IF}$ arises from the second term and the third term of formula (24), and reflects both the influence of the IQ mismatch in the orthogonal modulator 111 and the influence of the IQ mismatch in the orthogonal demodulator 112. On the other hand, the image component at the frequency $+3\omega_{IF}$ arises from the fourth term of formula (24), and reflects only the influence of the IQ mismatch in the orthogonal modulator 111. Therefore, in this embodiment, the IQ mismatch that occurs in the orthogonal modulator 111 and the IQ mismatch that occurs in the orthogonal demodulator 112 can be distinguished. Therefore, the IQ mismatch in the orthogonal modulator 111 and the IQ mismatch in the orthogonal demodulator 112 can be detected independently from each other.

$$\begin{aligned}x_{RF(RX)} &\approx [\cos(\omega_{IF}t) + j\sin(\omega_{IF}t)] + \left(1+\frac{3}{2}\alpha\right)\frac{\varepsilon'}{2}[\cos(\omega_{IF}t) - \\ &\quad j\sin(\omega_{IF}t)] + j\left(1+\frac{3}{2}\alpha\right)\frac{\varphi'}{2}[\cos(\omega_{IF}t) - \\ &\quad j\sin(\omega_{IF}t)] + \frac{1}{2}\alpha[\cos(3\omega_{IF}t) + j\sin(3\omega_{IF}t)]\end{aligned} \quad (24)$$

-continued
$$\begin{aligned}&= \exp\{j(+\omega_{IF})t\} + \left(1+\frac{3}{2}\alpha\right)\frac{\varepsilon'}{2}\exp\{j(-\omega_{IF})t\} + \\ &\quad j\left(1+\frac{3}{2}\alpha\right)\frac{\varphi'}{2}\exp(j(-\omega_{IF})t) + \frac{1}{2}\alpha\exp\{j(+3\omega_{IF})t\}\end{aligned}$$

<Modification of the First Embodiment>

As described above, the envelope detecting circuit 113 is an example of a detecting section, and the mixer circuit 114 is an example of a multiplying section. In this embodiment, the detecting section and the multiplying section are realized with circuits. However, the detecting section and the multiplying section may be realized with programs. An amplifier circuit as an example of an amplifying section may be provided between the envelope detecting circuit 113 and the mixer circuit 114. The amplifier circuit is explained in a second embodiment below. The modulator-demodulator 101 is realized with one integrated circuit in this embodiment. However, the modulator-demodulator 101 may be realized with two or more integrated circuits.

Second Embodiment

A second embodiment is a modification of the first embodiment. Concerning the second embodiment, differences from the first embodiment are mainly explained.

Figure 7:
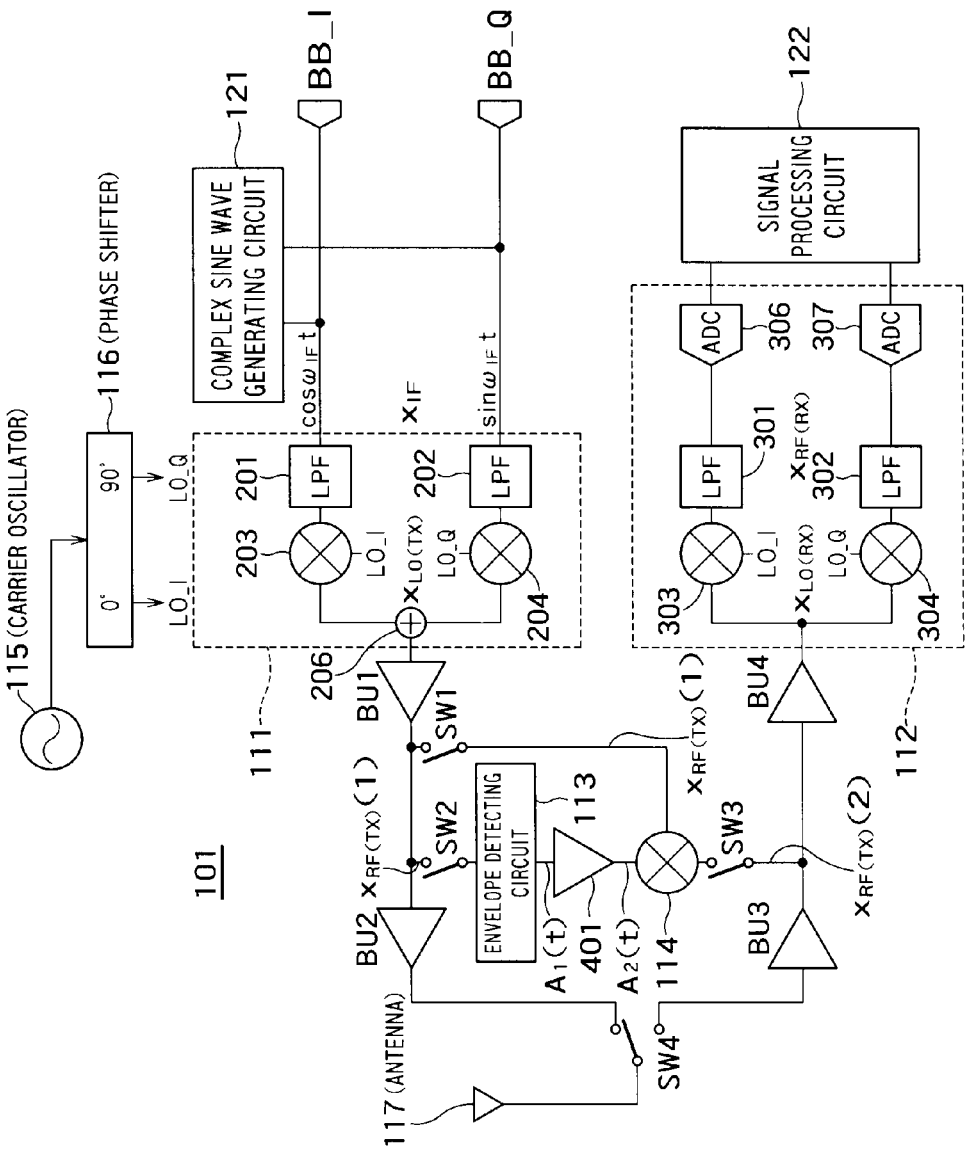
FIG. 7 shows a circuit configuration of a modulator-demodulator according to a second embodiment.

FIG. 7 shows a circuit configuration of a modulator-demodulator 101 according to the second embodiment. The modulator-demodulator 101 shown in FIG. 7 includes an orthogonal modulator 111 which modulates a signal to generate a modulated signal, an orthogonal demodulator 112 which demodulates the modulated signal to generate a demodulated signal, an envelope detecting circuit 113 as an example of a detecting section, a mixer circuit 114 as an example of a multiplying section, and an amplifier circuit 401 as an example of an amplifying section. The modulator-demodulator 101 shown in FIG. 7 further includes a complex sine wave generating circuit 121 that generates a highly accurate complex sine wave for an IQ mismatch detection, a signal processing circuit 122 that executes signal processing for the modulated signal, and circuit elements such as buffers and switches. The modulator-demodulator 101 shown in FIG. 7 is an example of the modulation/demodulation apparatus.

In the second embodiment, compared with the first embodiment, the modulator-demodulator 101 further includes the amplifier circuit 401. Therefore, in the second embodiment, an envelope component is further amplified than in the first embodiment.

<An Operation Example of the Modulator-demodulator According to the Second Embodiment (FIG. 7)>

Figure 8:
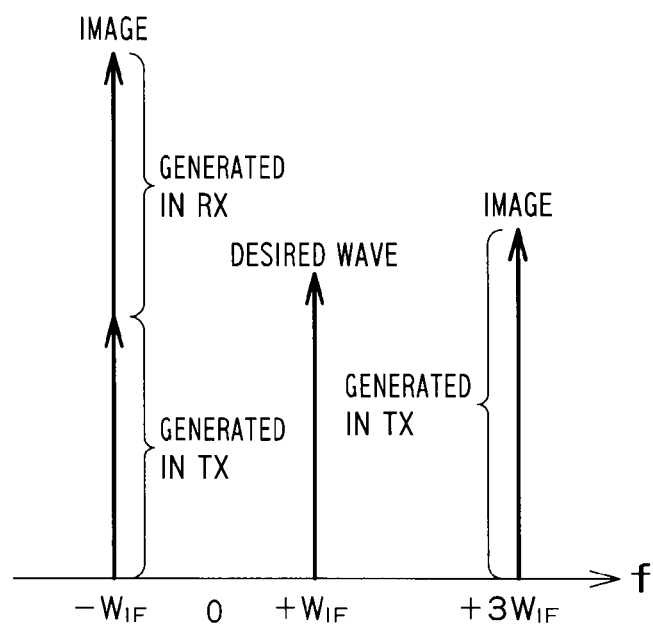
FIG. 8 illustrates a frequency distribution of a demodulated signal when IQ mismatches are present in an orthogonal modulator and an orthogonal demodulator (second embodiment)

An operation example of the modulator-demodulator 101 according to the second embodiment is explained below. Specifically, an operation performed when IQ mismatches are present in the orthogonal modulator 111 and the orthogonal demodulator 112 is explained with reference to formulas (25 to 28) and FIG. 8. FIG. 8 illustrates a frequency distribution of a demodulated signal in this case. Image components in the frequency distribution shown in FIG. 8 are larger than those shown in FIG. 6.

A complex sine wave $x_{IF}$ generated by the complex sine wave generating circuit 121 is inputted to the orthogonal modulator 111 and modulated into a modulated signal $x_{RF(TX)}$ (1). The modulated signal $x_{RF(TX)}$ (1) is outputted from the orthogonal modulator 111.

The modulated signal $x_{RF(TX)}$ (1) is inputted to the envelope detecting circuit 113. An envelope $A_1(t)$ of the modulated signal $x_{RF(TX)}$ (1) is detected by the envelope detecting circuit 113. An envelope signal $A_1(t)$ is outputted from the envelope detecting circuit 113.

The envelope signal $A_1(t)$ is inputted to the amplifier circuit 401. The envelope signal $A_1(t)$ is amplified by the amplifier circuit 401. An envelope signal $A_2(t)$ obtained by amplifying the envelope signal $A_1(t)$ is outputted from the amplifier circuit 401.

Each of the modulated signal $x_{RF(TX)}$ (1) and the envelope signal $A_2(t)$ is inputted to the mixer circuit 114. The modulated signal $x_{RF(TX)}$ (1) and the envelope signal $A_2(t)$ are multiplied together by the mixer circuit 114. A modulated signal $x_{RF(TX)}$ (2) obtained by multiplying the modulated signal $x_{RF(TX)}$ (1) and the envelope signal $A_2(t)$ together is outputted from the mixer circuit 114.

The modulated signal $x_{RF(TX)}$ (2) is inputted to the orthogonal demodulator 112 and demodulated into a demodulated signal $x_{RF(RX)}$. Then, for the demodulated signal $x_{RF(RX)}$ converted from an analog signal into an digital signal by the orthogonal demodulator 112, digital signal processing is executed by the signal processing circuit 122. An IQ mismatch present in the modulator-demodulator 101 is detected by the signal processing.

An operation performed when IQ mismatches are present in the orthogonal modulator 111 and the orthogonal demodulator 112 is explained. The explanation regarding formula (15) to formula (22) is common to the first embodiment and the second embodiment. Therefore, the envelope $A_1(t)$ is represented by formula (25).

$$A_1(t) = 1 + \cos(2\omega_{IF}t) \quad (25)$$

In this embodiment, DC component is removed from the envelope signal $A_1(t)$ by an HPF before amplification. Then, the envelope signal $A_1(t)$ is amplified m times (m>1) by the amplifier 115, and is added with the DC component after the amplification. Thereby, the envelope signal $A_1(t)$ is amplified into the envelope signal $A_2(t)$. Therefore, the envelope $A_2(t)$ is represented by formula (26).

$$A_2(t) = 1 + \alpha m \cos(2\omega_{IF}t) \quad (26)$$

Therefore, the signal waveform of the modulated signal $x_{RF(TX)}$ (2) is represented by formula (27).

$$\begin{aligned} x_{RF(TX)}(2) &= [\cos(\omega_{RF}t) + \alpha\cos\{(\omega_{RF} - 2\omega_{IF})t\}] \times \\ & \quad [1 + \alpha m \cos(2\omega_{IF}t)] \\ &\approx \{1 + \alpha m \cos(2\omega_{IF}t)\}\cos(\omega_{RF}t) + \\ & \quad \alpha\cos\{(\omega_{RF} - 2\omega_{IF})t\} \\ &= \cos(\omega_{RF}t) + \frac{1}{2}\alpha m \cos\{(\omega_{RF} + 2\omega_{IF})t\} + \\ & \quad \frac{1}{2}\alpha(m+2)\cos\{(\omega_{RF} - 2\omega_{IF})t\} \\ &= \cos(\omega_{RF}t) + \frac{1}{2}\alpha m \cos\{(\omega_{RF} + 2\omega_{IF})t\} + \\ & \quad \frac{1}{2}\alpha m \cos\{(\omega_{RF} - 2\omega_{IF})t\} \end{aligned} \quad (27)$$

Therefore, the signal waveform of the demodulated signal $x_{RF(RX)}$ is represented by formula (28). The frequency distribution of the demodulated signal $x_{RF(RX)}$ is shown in FIG. 8. As shown in FIG. 8, in the demodulated signal $x_{RF(RX)}$, a desired wave component at a frequency $+\omega_{IF}$ has the magnitude same as that in the first embodiment. However, image components at a frequency $-\omega_{IF}$ and a frequency $+3\omega_{IF}$ are larger than those in the first embodiment. This is because, whereas an amplification factor "m" is not included in the first term of formula (28), the amplification factor "m" is included in the second, third, and fourth terms of formula (28). In this way, in the second embodiment, since the image components of the demodulated signal $x_{RF(RX)}$ are amplified, detection sensitivity and detection accuracy for IQ mismatches are improved.

$$\begin{aligned} x_{RF(RX)} &\approx [\cos(\omega_{RF}t) + j\sin(\omega_{IF}t)] + \left(1 + \frac{1}{2}\alpha m\right)\frac{\varepsilon'}{2} \\ & \quad [\cos(\omega_{IF}t) - j\sin(\omega_{IF}t)] + j\left(1 + \frac{1}{2}\alpha m\right)\frac{\varphi'}{2} \\ & \quad [\cos(\omega_{IF}t) - j\sin(\omega_{IF}t)] + \frac{1}{2}\alpha m [\cos(3\omega_{IF}t) + \\ & \quad j\sin(3\omega_{IF}t)] \\ &= \exp\{j(+\omega_{IF})t\} + \left(1 + \frac{1}{2}\alpha m\right)\frac{\varepsilon'}{2}\exp\{j(-\omega_{IF})t\} + \\ & \quad j\left(1 + \frac{1}{2}\alpha m\right)\frac{\varphi'}{2}\exp\{j(-\omega_{IF})t\} + \\ & \quad \frac{1}{2}\alpha m \exp\{j(+3\omega_{IF})t\} \end{aligned} \quad (28)$$

Third Embodiment

A third embodiment is a modification of the first and second embodiments. Concerning the third embodiment, differences from the first and second embodiments are mainly explained.

Figure 9:
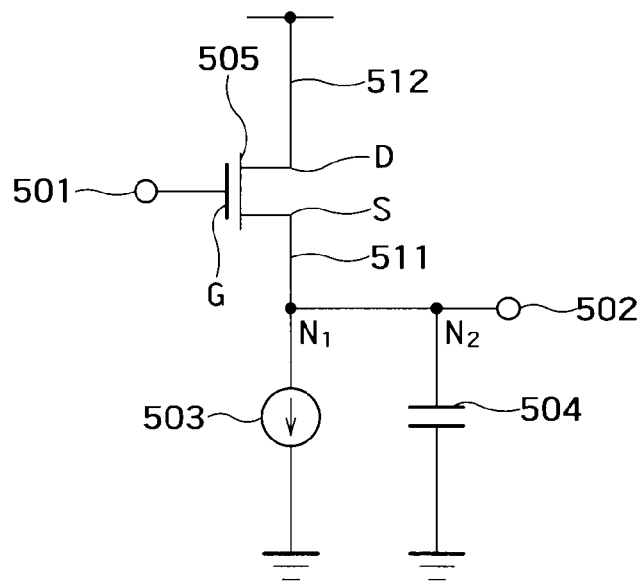
FIG. 9 shows a circuit configuration of an envelope detecting circuit according to a third embodiment.

The circuit configuration of the modulator-demodulator 101 according to the third embodiment is as shown in FIG. 1 or FIG. 7. FIG. 9 shows a circuit configuration of the envelope detecting circuit 113 according to the third embodiment. The envelope detecting circuit 113 shown in FIG. 9 includes an input terminal 501 of the envelope detecting circuit 113, an output terminal 502 of the envelope detecting circuit 113, a current source 503, a capacitor 504, and a MOSFET 505 as an example of a field effect transistor.

The input terminal 501 is connected to one end of the second switch SW2. The output terminal 502 is connected to one end of the third switch SW3.

The MOSFET 505 is a transistor for signal input. A gate terminal G of the MOSFET 505 is connected to the input terminal 501. A source terminal S of the MOSFET 505 is connected to the output terminal 502, the current source 503, and the capacitor 504. The source terminal S of the MOSFET 505 is connected to a first power supply line 511. A drain terminal D of the MOSFET 505 is connected to a second power supply line 512. In the third embodiment, the envelope detecting circuit 113 that detects an envelope of a modulated signal is realized by such a configuration. There are a first node $N_1$ and a second node $N_2$ between the source terminal S and the output terminal 502. The current source 503 is connected between the first node $N_1$ and the ground. The capacitor 504 is connected between the second node $N_2$ and the ground.

An operation example of the envelope detecting circuit 113 is explained. First, a modulated signal is inputted to the input terminal 501. Subsequently, a gate voltage corresponding to the modulated signal is applied to the gate terminal G. Subsequently, a drain current corresponding to the gate voltage flows between the source terminal S and the drain terminal D according to a switching action of the MOSFET 505. A supply source of the drain current is the current source 503. Subsequently, charges are accumulated in respective electrodes of the capacitor 504 by the drain current and a voltage is generated between the electrodes of the capacitor 504. Subsequently, a signal corresponding to the voltage is outputted to the output terminal 502. The signal is changed to an envelope signal by an integration action (low-pass action) of the capacitor 504.

As described above, embodiments of the present invention can make it possible to detect errors regarding an orthogonal modulation and an orthogonal demodulation independently from each other.

What is claimed is:

1. A modulation/demodulation apparatus comprising:
   a sine wave generating circuit configured to output two sine waves which are orthogonal to each other and have equal amplitude;
   an orthogonal modulator connected to the sine wave generating circuit and configured to modulate the sine waves to generate a modulated signal;
   a detecting section configured to detect amplitude fluctuation in the modulated signal;
   a multiplying section configured to multiply the modulated signal and the amplitude fluctuation detected by the detecting section together; and
   an orthogonal demodulator configured to demodulate the modulated signal multiplied with the amplitude fluctuation by the multiplying section to generate a demodulated signal.

2. The apparatus according to claim 1, further comprising:
   an amplifying section configured to amplify the amplitude fluctuation detected by the detecting section,
   wherein the multiplying section multiplies the modulated signal and the amplitude fluctuation detected by the detecting section and amplified by the amplifying section together.

3. The apparatus according to claim 1, further comprising:
   a carrier oscillator configured to output a carrier; and
   a phase shifter configured to output, based on the carrier, two local oscillation signals,
   wherein the orthogonal modulator modulates the sine waves using the local oscillation signals, and the orthogonal demodulator demodulates the modulated signal using the local oscillation signals.

4. The apparatus according to claim 3, wherein,
   the orthogonal modulator comprises:
   a first multiplier configured to multiply one wave of the sine waves and one signal of the local oscillation signals together to modulate the one wave of the sine waves;
   a second multiplier configured to multiply the other wave of the sine waves and the other signal of the local oscillation signals together to modulate the other wave of the sine waves; and
   an adder configured to add the modulated sine waves together.

5. The apparatus according to claim 3, wherein,
   the orthogonal demodulator comprises:
   a third multiplier configured to multiply the modulated signal multiplied with the amplitude fluctuation by the multiplying section and one signal of the local oscillation signals together; and
   a fourth multiplier configured to multiply the modulated signal multiplied with the amplitude fluctuation by the multiplying section and the other signal of the local oscillation signals together.

6. The apparatus according to claim 5, wherein,
   the orthogonal demodulator further comprises:
   a first analog-digital converter configured to convert a signal extracted via the multiplication by the third multiplier, from an analog signal to a digital signal; and
   a second analog-digital converter configured to convert a signal extracted via the multiplication by the third multiplier, from an analog signal to a digital signal.

7. The apparatus according to claim 1, wherein the sine wave generating circuit generates the sine waves which have a phase difference of 90 degrees.

8. The apparatus according to claim 1, wherein,
   when IQ mismatches are present in the orthogonal modulator and the orthogonal demodulator, the demodulated signal contains a component at a frequency $+\omega_{IF}$, a component at a frequency $-\omega_{IF}$ and a component at a frequency $+3\omega_{IF}$, where $\omega_{IF}$ denotes the frequency of the sine waves.

9. The apparatus according to claim 2, wherein,
   when IQ mismatches are present in the orthogonal modulator and the orthogonal demodulator, the demodulated signal contains a component at a frequency $+\omega_{IF}$, a component at a frequency $-\omega_{IF}$ and a component at a frequency $+3\omega_{IF}$, and the component at the frequency $-\omega_{IF}$ and the component at the frequency $+3\omega_{IF}$ are amplified by the amplifying section, where $\omega_{IF}$ denotes the frequency of the sine waves.

10. The apparatus according to claim 1, wherein,
    the detecting section is a detection circuit including an input terminal, an output terminal, a current source, a capacitor, and a field effect transistor which has a gate connected to the input terminal and has a source connected to the output terminal, the current source, and the capacitor.

11. The apparatus according to claim 10, wherein,
    the current source is connected between a first node and the ground, the first node being between the source of the transistor and the output terminal, and
    the capacitor is connected between a second node and the ground, the second node being between the source of the transistor and the output terminal.

12. A modulation/demodulation method comprising:
    outputting two sine waves which are orthogonal to each other and have equal amplitude;
    modulating the sine waves to generate a modulated signal;
    detecting amplitude fluctuation in the modulated signal;
    multiplying the modulated signal and the amplitude fluctuation detected by the detection together; and
    demodulating the modulated signal multiplied with the amplitude fluctuation by the multiplication to generate a demodulated signal.

13. The method according to claim 12, further comprising:
    amplifying the amplitude fluctuation detected by the detection,
    wherein in the multiplication, the modulated signal and the amplitude fluctuation detected by the detection and amplified by the amplification are multiplied together.

14. The method according to claim 12, further comprising:
    outputting a carrier; and
    outputting, based on the carrier, two local oscillation signals,
    wherein in the modulation, the sine waves are modulated using the local oscillation signals, and in the demodulation, the modulated signal is demodulated using the local oscillation signals.

15. The method according to claim 14 wherein,
the modulation comprises:
multiplying one wave of the sine waves and one signal of the local oscillation signals together to modulate the one wave of the sine waves;
multiplying the other wave of the sine waves and the other signal of the local oscillation signals together to modulate the other wave of the sine waves; and
adding the modulated sine waves together.

16. The method according to claim 14, wherein,
the demodulation comprises:
multiplying the modulated signal multiplied with the amplitude fluctuation by the multiplication and one signal of the local oscillation signals together; and
multiplying the modulated signal multiplied with the amplitude fluctuation by the multiplication and the other signal of the local oscillation signals together.

17. The method according to claim 16, wherein,
the demodulation further comprises:
converting a signal extracted via the multiplication of the modulated signal with the one signal of the local oscillation signals, from an analog signal to a digital signal; and
converting a signal extracted via the multiplication of the modulated signal with the other signal of the local oscillation signals, from an analog signal to a digital signal.

18. The method according to claim 12, wherein the sine waves have a phase difference of 90 degrees.

19. The method according to claim 12, wherein,
when IQ mismatches are present in an orthogonal modulator for the modulation and an orthogonal demodulator for the demodulation, the demodulated signal contains a component at a frequency $+\omega_{IF}$, a component at a frequency $-\omega_{IF}$ and a component at a frequency $+3\omega_{IF}$, where $\omega_{IF}$ denotes the frequency of the sine waves.

20. The method according to claim 13, wherein,
when IQ mismatches are present in an orthogonal modulator for the modulation and an orthogonal demodulator for the demodulation, the demodulated signal contains a component at a frequency $+\omega_{IF}$, a component at a frequency $-\omega_{IF}$ and a component at a frequency $+3\omega_{IF}$, and the component at the frequency $-\omega_{IF}$ and the component at the frequency $+3\omega_{IF}$ are amplified by the amplification, where $\omega_{IF}$ denotes the frequency of the sine waves.

* * * * *